(12) United States Patent
Irie

(10) Patent No.: US 7,230,496 B2
(45) Date of Patent: Jun. 12, 2007

(54) FREQUENCY SYNTHESIZER, RADIO COMMUNICATION SYSTEM USING THE SYNTHESIZER, AND CONTROL METHOD OF THE SYNTHESIZER

(75) Inventor: Masatake Irie, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 170 days.

(21) Appl. No.: 11/059,691

(22) Filed: Feb. 17, 2005

(65) Prior Publication Data

US 2005/0237119 A1  Oct. 27, 2005

(30) Foreign Application Priority Data

Feb. 19, 2004  (JP)  ............... 2004-042425

(51) Int. Cl.
*H03L 7/00* (2006.01)
(52) U.S. Cl. .................. 331/16; 331/179; 331/177 R
(58) Field of Classification Search ................ 331/1 A, 331/16, 34, 179, 177 R
See application file for complete search history.

(56) References Cited

U.S. PATENT DOCUMENTS 6,686,804 B1 * 2/2004 Adams et al. ................. 331/17

2001/0052823 A1  12/2001 Hirano et al.
2006/0258312 A1 * 11/2006 Uozumi et al. .......... 455/252.1

FOREIGN PATENT DOCUMENTS

| EP | 1 168 627 | 1/2002 |
|----|-----------|--------|
| JP | 2001-339301 | 12/2001 |
| JP | 2003-152535 | 5/2003 |
| WO | 03/044961 | 5/2003 |

* cited by examiner

*Primary Examiner*—Arnold Kinkead
(74) *Attorney, Agent, or Firm*—Wenderoth, Lind & Ponack, L.L.P.

(57) ABSTRACT

A frequency synthesizer includes a VCO (1), measures an oscillation frequency of each of multiple bands with a predetermined voltage (V1) applied to the VCO (1), and stores the measurement result to a storage circuit (11). The synthesizer compares a frequency division ratio from a PLL control circuit (14) with the measured oscillation frequency stored to the storage circuit, and selects one band from VCO (1) based on the comparison result. The synthesizer causes the VCO (1) to oscillate on the selected band with a fixed voltage, and determines a frequency band to be used for phase-locked operation in actual based on an error between the oscillation frequency and a reference frequency.

7 Claims, 7 Drawing Sheets

FREQUENCY SYNTHESIZER, RADIO COMMUNICATION SYSTEM USING THE SYNTHESIZER, AND CONTROL METHOD OF THE SYNTHESIZER

FIELD OF THE INVENTION

The present invention relates to frequency synthesizers used in mobile radios, and more particularly to a frequency synthesizer including a voltage controlled oscillator (VCO) which can oscillate at multiple frequency bands.

RELATED ART

In radio communication systems such as cellular phones, a frequency synthesizer is typically used as a local oscillator which generates an oscillation signal of a predetermined frequency to be combined with receiving and transmitting signals.

As a conventional cellular phone, there is a dual-band cellular phone which can handle signals of two frequency bands, such as GSM (Global System for Mobile Communication) of 880 to 915 MHz frequency band and DCS (Digital Cellular System) of 1,710 to 1,785 MHz frequency band. In addition, as such a dual-band cellular phone, there is a phone which can switch the output frequency of PLL circuit to handle two frequency bands by use of a single PLL circuit.

In recent years, there is an increasing demand for triple-band cellular phones which can handle for example, PCS (Personal Communication System) of 1,850 to 1915 MHz frequency band in addition to GSM and DCS. Thus, demands for handling still more frequency bands are expected.

From viewpoints of the miniaturization and cost reduction of cellular phones, etc., direct-conversion system is useful for a high-frequency semiconductor integrated circuit (hereinafter referred to as a "high-frequency LSI") performing modulation and demodulation of transmitting and receiving signals, which is used in cellular phones capable of handling multiple frequency bands. The direct-conversion system, has an advantage that multiple frequency bands can be comparatively easily handled, but has a problem that oscillatable frequency range of voltage controlled oscillator (hereinafter referred to as a "VCO") is broadened. Specifically, handling all frequencies with a single VCO will lead to increased sensitivity (change amount or variation of oscillation frequency per voltage: [Hz/V]) of VCO control voltage, whereby the VCO can be easily affected by external noises and the variation of power source voltage, thus degrading the C/N (Carrier/Noise) performance.

Meanwhile, VCOs, which are generally composed of a module component, constitute a limiting factor of miniaturization of cellular phones, etc. Accordingly, demands for a VCO to be made of an IC are rising. However, when a VCO is made of an IC, the oscillation frequency can be widely changed due to manufacture variations of the element constituting the VCO, so that the phase locking can not be performed at a predetermined frequency.

In order to solve this problem, a method may be employed such that multiple fixed-capacitors are connected in parallel with the parallel resonant circuit of VCO, and the fixed-capacitors are trimmed with laser, etc. during manufacture to set the oscillation frequency. In this case, however, the ICs are to be individually adjusted, thus increasing manufacturing cost. Alternatively, a method of increasing VCO control sensitivity may also be employed. As described above, however, due to increased control sensitivity, the VCO can be easily affected by external noises and the variation of power source voltage, thus causing another problem of degrading the C/N performance.

As conventional arts related to the oscillation circuit including a VCO, there have been known ones disclosed in Patent documents 1 and 2, for example.

Patent document 1: 2003-152535
Patent document 2: 2001-339301

Providing the parallel resonant circuit of VCO, with a section for switching multiple capacitors or inductors allows the resonance frequency to be switched finely so that multiple frequency bands can be used. As shown in FIG. 2A, to a VCO having a single frequency band, in order to enable oscillation in a wide range from frequency $f_L$ to frequency $f_H$, the control sensitivity of VCO needs to be high. On the other hand, as shown in FIG. 2B, when a VCO has multiple (a number N of) frequency bands, the resonance frequency can be finely switched, thereby the control sensitivity of VCO can be reduced, thus improving the C/N performance.

With such frequency synthesizer using a VCO of multiple frequency bands, in order to obtain a desired oscillation frequency, a frequency band to which the phase can be locked should be determined.

According to Patent documents 1 and 2, in order to avoid cost increase caused by individual adjustments in fabricating ICs of VCO, frequency bands are automatically selected based on a frequency division ratio setting supplied from an external PLL control circuit.

The features of a frequency synthesizer according to Patent document 1 are as follows. First, regarding a VCO having multiple frequency bands, the oscillation frequency of each band are examined in advance by a frequency examination section, and the examination result is stored into a storage apparatus. Then, in a band selection circuit, the stored value is compared with a desired frequency to select a band. With this method, however, when a change of operational environment, such as the temperature change and the variation of power source voltage of IC, occurs after the oscillation frequencies are stored, the oscillation frequencies of VCO can be different between at the time of the storage operation and at the time of the actual operation. Accordingly, when the data stored by the storage operation is directly used, that is a problem that an optimum band cannot always be obtained in the actual operation. Expecting the change of oscillation frequency due to such changes of operational environment, a method of broadening the frequency coverage of each band, i.e. of raising the control sensitivity of VCO may be considered. However, if the control sensitivity of VCO is raised, as described above the VCO can be easily affected by the external noises and the variation of power source voltage, thus reducing the C/N performance.

In a frequency synthesizer according to Patent document 2, whenever the phase locking is performed, the oscillation frequency of VCO is expected to select an optimum band at that time. Consequently, the changes of temperature and applied voltage level as well as manufacture variations can always be coped with.

Specifically, after a frequency division ratio setting is supplied from an external PLL control circuit, the time difference between a reference signal $f_{ref}$ and comparison signal $f_{div}$ is detected to expect the oscillation frequency of VCO. Then, the band switching and the expectation of oscillation frequency are repeated until the time difference between the reference signal $f_{ref}$ and comparison signal $f_{div}$ becomes a predetermined value or less, that is, until the difference between the oscillation frequency of VCO and the desired frequency becomes a predetermined value or less. With this method, however, in finally determining the band at which the phase locking is performed, the lock-up time can be increased by a period of time obtained by multiplying the number of times of performing the time difference detection operation by a period of time taken to perform one time difference detection operation.

Even if the period of time taken to perform one operation of expecting the oscillation frequency is reduced to shorten the period of time taken to determine the band, the accuracy may be reduced, thus increasing the number of times of switching the VCO band until the difference from the desired frequency becomes a predetermined value or less. Consequently, the period of time taken to determine the band cannot be reduced as much as expected. Also, due to the degraded accuracy, the phase cannot be locked in the worst case.

In addition, manufacture variations of VCO also constitute a factor of reducing the accuracy of expecting the oscillation frequency because the oscillation frequency or the relation between each band can change. Also, if the number of bands is increased to lower the control sensitivity of VCO, the number of times of switching the bands may be increased due to the accuracy of expecting the oscillation frequency, thus increasing the period of time taken to determine the band and increasing the lock-up time.

It is well known that, when the period of time taken to determine the band becomes an unnegligible due to the above reasons, the C/N performance is reduced if the loop filter constant is changed to meet the specification of lock-up time.

As described above, the conventional circuits which automatically select VCO bands is hard to obtain a frequency synthesizer having a satisfactory C/N performance.

SUMMARY OF THE INVENTION

To solve the above described problems, an object of the invention is to provide a frequency synthesizer which can achieve a satisfactory C/N performance by use of a VCO having multiple frequency bands and which is low in manufacturing cost.

A frequency synthesizer according to the present invention includes: a voltage controlled oscillator which can oscillate at multiple frequency bands, and outputs a signal of a frequency corresponding to a voltage applied to a control voltage terminal; a comparison frequency divider which outputs a signal obtained by dividing the frequency of the voltage controlled oscillator; a reference frequency divider which divides the frequency of a reference signal; a phase comparator which compares the phase between the output signal of the comparison frequency divider and an output signal of the reference frequency divider to output a signal for the phase difference; a charge pump which converts the output signal of the phase comparator into a voltage; a loop filter which smoothes the output voltage of the charge pump to apply the resulting voltage to the control voltage terminal of the voltage controlled oscillator; and a band control circuit which sets the frequency band of the voltage controlled oscillator at the time of oscillation operation.

The band control circuit includes: a frequency examination section that measures the oscillation frequency for each of a predetermined number of frequency bands of the voltage controlled oscillator; a storage section that stores the oscillation frequency of each frequency band measured by the frequency examination means; an initial-band selection section that selects, based on a frequency supplied from a PLL control circuit, one of the frequency bands whose oscillation frequency is stored in the storage means; and a frequency adjustment section that measures the oscillation frequency of the voltage controlled oscillator at the one frequency band selected by the initial-band selection section, determines one frequency band to be used in oscillation operation based on the measured oscillation frequency, and sets the determined frequency band into the voltage controlled oscillator.

The frequency synthesizer according to the present invention can be incorporated into a radio communication system.

A method according to the present invention is a control method of a frequency synthesizer with a voltage controlled oscillator having multiple frequency bands. The method includes: measuring, with a predetermined voltage applied to the voltage controlled oscillator, the oscillation frequency of the voltage controlled oscillator for each of a predetermined number of frequency bands; storing the measured oscillation frequency of each frequency band; selecting one frequency band from the frequency bands whose oscillation frequencies are stored based on a frequency supplied from a PLL control circuit; measuring, with the predetermined voltage applied to the voltage controlled oscillator, the oscillation frequency of the voltage controlled oscillator at the one frequency band selected; determining one frequency band to be used in oscillation operation based on an error between the measured oscillation frequency and a reference frequency; and setting the determined frequency band to the voltage controlled oscillator.

According to the present invention, even when the oscillation frequency changes due to manufacture variations of the elements constituting the voltage controlled oscillator (VCO), and even when a change of environment, such as the temperature change and the variation of power source voltage of IC, occurs during the operation of the integrated circuit, the phase locking can be performed at a desired frequency, because the frequency band is determined according to the actual oscillation frequency of VCO. In addition, since the VCO can be made of an IC, miniaturization and cost reduction can be achieved. Since the resonance frequency of VCO can be finely switched, the control sensitivity of VCO can be reduced. Also, since the oscillation frequency is measured and stored in advance, the oscillation frequency of VCO can be calculated with high accuracy. Accordingly, the band can be determined in a short period of time, thus reducing the lock-up time. Consequently, a satisfactory C/N performance can be achieved.

Also, by providing this frequency synthesizer to a radio communication system, a miniaturized and low-cost radio communication system having a satisfactory communication quality can be implemented.

DESCRIPTION OF THE PREFERRED EMBODIMENT

An embodiment of the present invention will be described below with reference to the accompanying drawings.

1. Overall Configuration of Frequency Synthesizer

Figure 1:
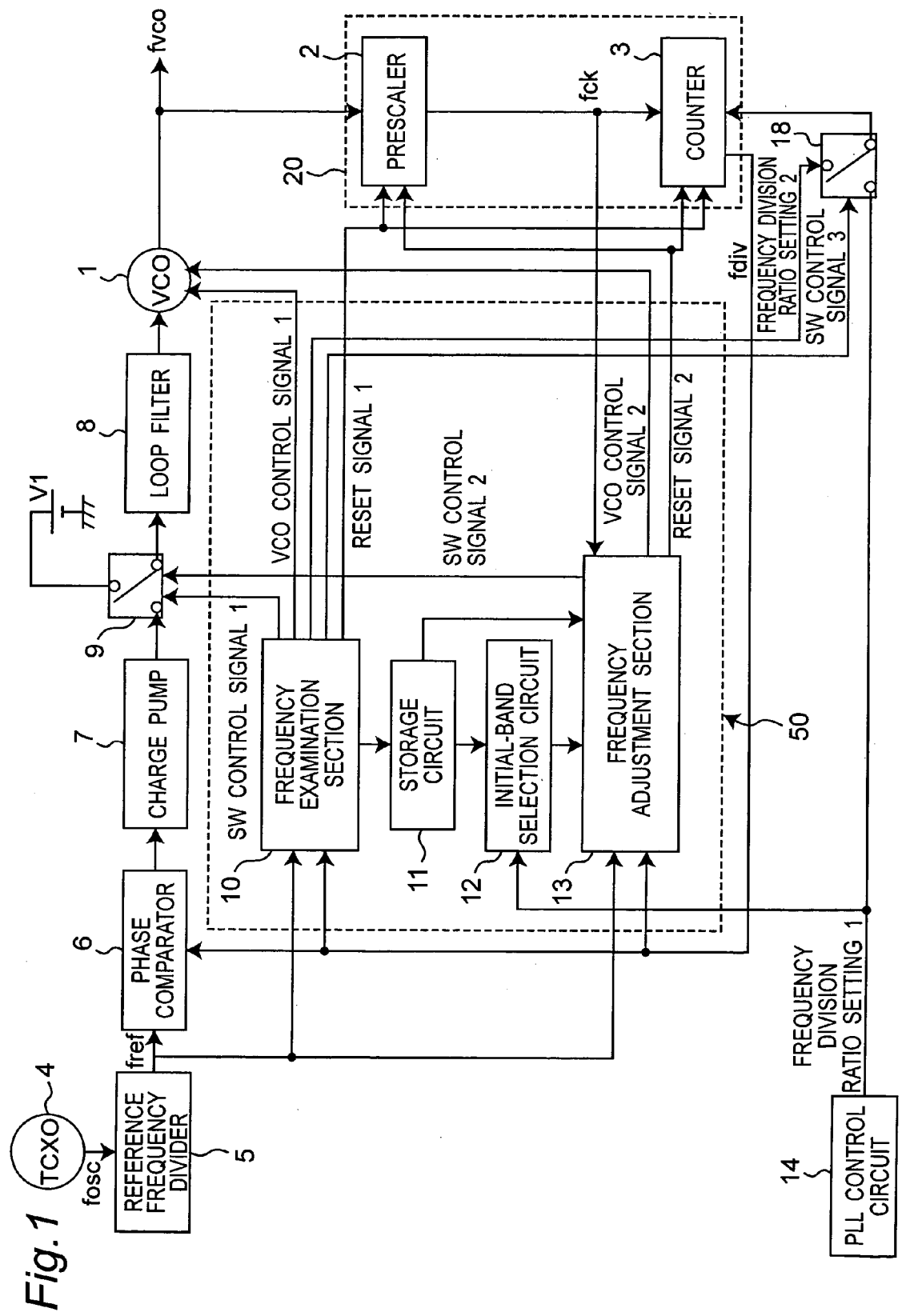
FIG. 1 is a block diagram showing a frequency synthesizer according to an embodiment of the present invention.

FIG. 1 is a block diagram of a frequency synthesizer according to the present invention.

The frequency synthesizer includes: a VCO1 (voltage controlled oscillator) which has a control voltage terminal and outputs a signal of a frequency corresponding to a voltage applied to the control voltage terminal; a prescaler 2 which divides the output signal $f_{VCO}$ of VCO1; a counter 3 which counts an output signal of the prescaler 2; a reference oscillation circuit 4 (hereinafter referred to as "TCXO") which oscillates at a highly accurate frequency by means of a crystal oscillator; a reference frequency divider 5 which divides an output signal $f_{OSC}$ of the TCXO4; a phase comparator 6 which compares the phase of an output signal $f_{div}$ of the counter 3 with that of an output signal $f_{ref}$ of the reference frequency divider 5 to output a phase difference; a charge pump 7 which converts the output signal of the phase comparator 6 to a voltage or current; and a loop filter 8 which smoothes an output signal of the charge pump 7.

Figure 2A:
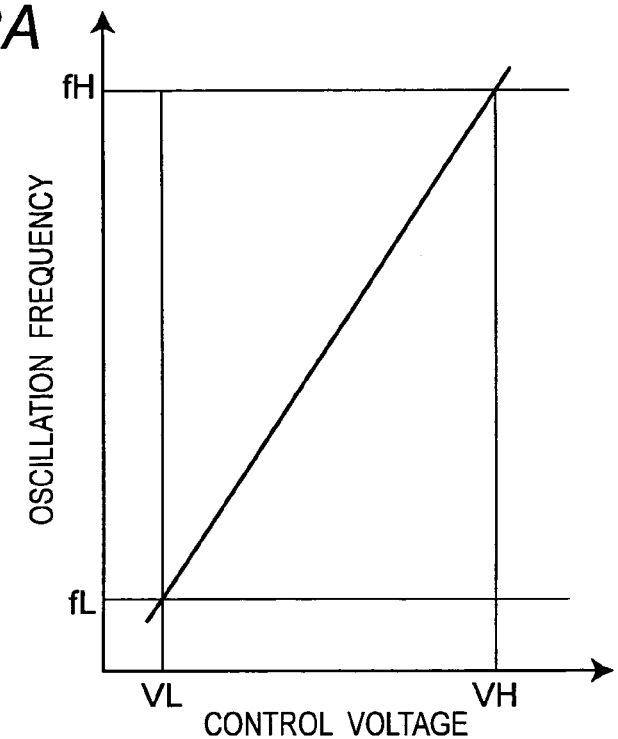
FIG. 2A is a diagram showing a relationship between control voltage and oscillation frequency in a VCO having a single oscillation frequency band.
Figure 2B:
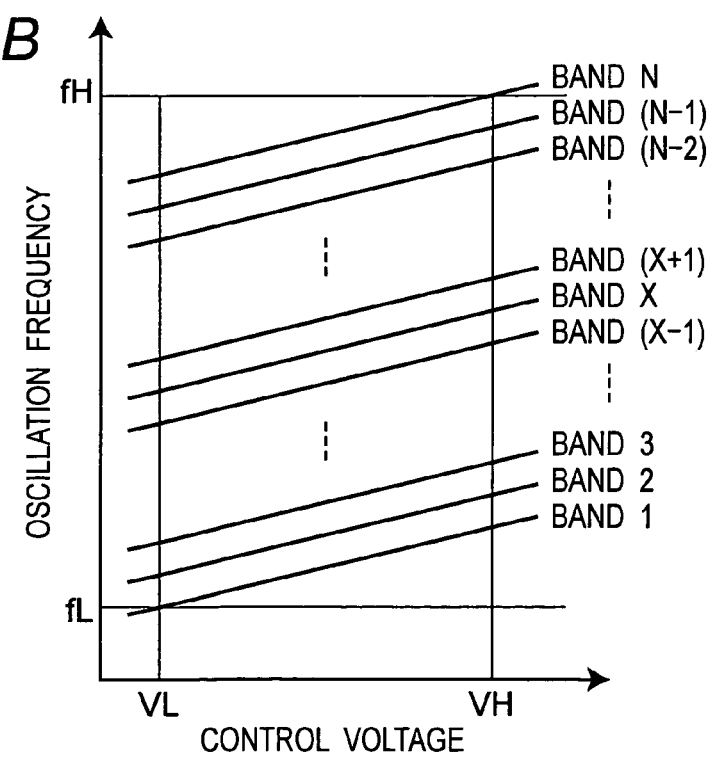
FIG. 2B is a diagram showing a relationship between control voltage and oscillation frequency in a VCO having multiple oscillation frequency bands.

The VCO1 has multiple frequency bands and can switch finely the oscillation frequency. Specifically, as shown in FIG. 2B, VCO1 has a number N of bands, which are band 1, and bands 2, . . . , band N in order of low oscillation frequency. The prescaler 2 and counter 3 constitutes a variable pulse-swallow frequency divider 20. The phase comparator 6, charge pump 7, loop filter 8, VCO1, prescaler 2 and counter 3 constitutes a closed loop. This configuration is similar to that of a typical PLL circuit.

The frequency synthesizer further includes a band control section 50 which controls the frequency band of VCO1. The band control section 50 includes: a frequency examination section 10 which measures the oscillation frequency of each band of VCO1 for a fixed voltage V1; a storage circuit 11 which stores the measurement result from the frequency examination section 10; an initial-band selection circuit 12 which determines the initial band to be used for frequency adjustment; and a frequency adjustment section 13 which determines a plurality of bands actually used.

Practically, the storage circuit 11 stores the information on frequency division ratio setting as the information on oscillation frequency of each band. This is because an oscillation frequency is uniquely determined by specifying a frequency division ratio setting since "frequency division ratio setting" is proportional to "oscillation frequency". In the description of the embodiment, the term "frequency division ratio setting" may be sometimes used synonymously with the term "oscillation frequency".

The initial-band selection circuit 12 determines an initial band from an oscillation frequency of VCO1 stored in the storage circuit 11 and a frequency division ratio setting 1 supplied from a PLL control circuit 14. The frequency adjustment section 13 determines one band to be actually used at the time when phase locking is performed from among a group of bands determined by the initial-band selection circuit 12. The band of VCO1 can be switched according to a VCO control signal 1 from the frequency examination section 10 or according to a VCO control signal 2 from the frequency adjustment section 13.

Also, the frequency synthesizer has two switches 9 and 18.

The switch 9 is switched according to a SW control signal 1 from the frequency examination section 10 or a SW control signal 2 from the frequency adjustment section 13. An output signal of the charge pump 7 or the predetermined bias voltage V1 is connected to the loop filter 8 via the switch 9. Alternatively, an output signal of the loop filter 8 or the predetermined bias voltage V1 may be supplied to VCO1 via the switch 9. In the embodiment, the predetermined bias voltage V1 is set to a level equal to the lowest voltage VL. The switch 9 is switched to the loop filter 8 during the normal operation by the frequency synthesizer, while the switch 9 is switched to the voltage source V1 during the examination of the oscillation frequency of frequency band of VCO1, the selection of the initial band, or the setting of the optimum band.

The switch 18 is used for switching the frequency division ratio which is set in the counter 3 and provides a frequency division ratio setting 2 from the frequency examination section 10 or a frequency division ratio setting 1 from the PLL control circuit 14 to the counter 3. The switch 18 is switched by a SW control signal 3 from the frequency examination section 10.

2. Operation of Frequency Synthesizer 2.1 Summary of Operation

The frequency synthesizer according to the embodiment has a configuration similar to that of a typical frequency synthesizer except the band control section 50, and performs a similar oscillation operation. Before initiating the oscillation operation, the band control section 50 determines an optimum frequency band from multiple frequency bands as a frequency band to be used in VCO1. The summary of operation of the band control section 50 will be described below.

(Step 1) Examination (Measurement) and Storage of Oscillation Frequency of Each Band of VCO Upon application of a power to an apparatus into which the frequency synthesizer is incorporated, first, the band control section 50 examines the oscillation frequency (frequency division ratio) of each band of VCO1 and stores the result. More specifically, the fixed voltage V1 is applied to VCO1 to measure oscillation frequencies (frequency division ratios) with respect to several predetermined bands of VCO1 and then store the measurement result into the storage circuit 11.

Subsequently, an oscillation frequency (frequency division ratio) is received from the PLL control circuit 14. With reference to the stored oscillation frequency (frequency division ratio) of each band, one band at which VCO1 is made to operate is determined. VCO1 is made to perform the oscillation operation at the determined band. More specifically, the following two operations are performed.

(Step 2) Selection of Initial Band

The frequency division ratio setting value from the PLL control circuit 14 is compared with the stored frequency division ratio setting value for each band, and one band having a frequency division ratio close to the frequency division ratio setting value from the PLL control circuit 14 is selected as "initial band".

(Step 3) Setting of Optimum Band

Subsequently, the frequency band of VCO1 is set to the selected initial band. With the fixed voltage V1 applied to VCO1, the oscillation frequency at the initial band is measured. An error between the measured oscillation frequency and reference frequency is detected. Based on the error, the optimum band to be used for the actual oscillation operation is selected. Then, VCO1 is made to perform the oscillation operation at the selected band.

The details of the operation of the band control section 50 will be described below for each of the above described steps.

Figure 3:
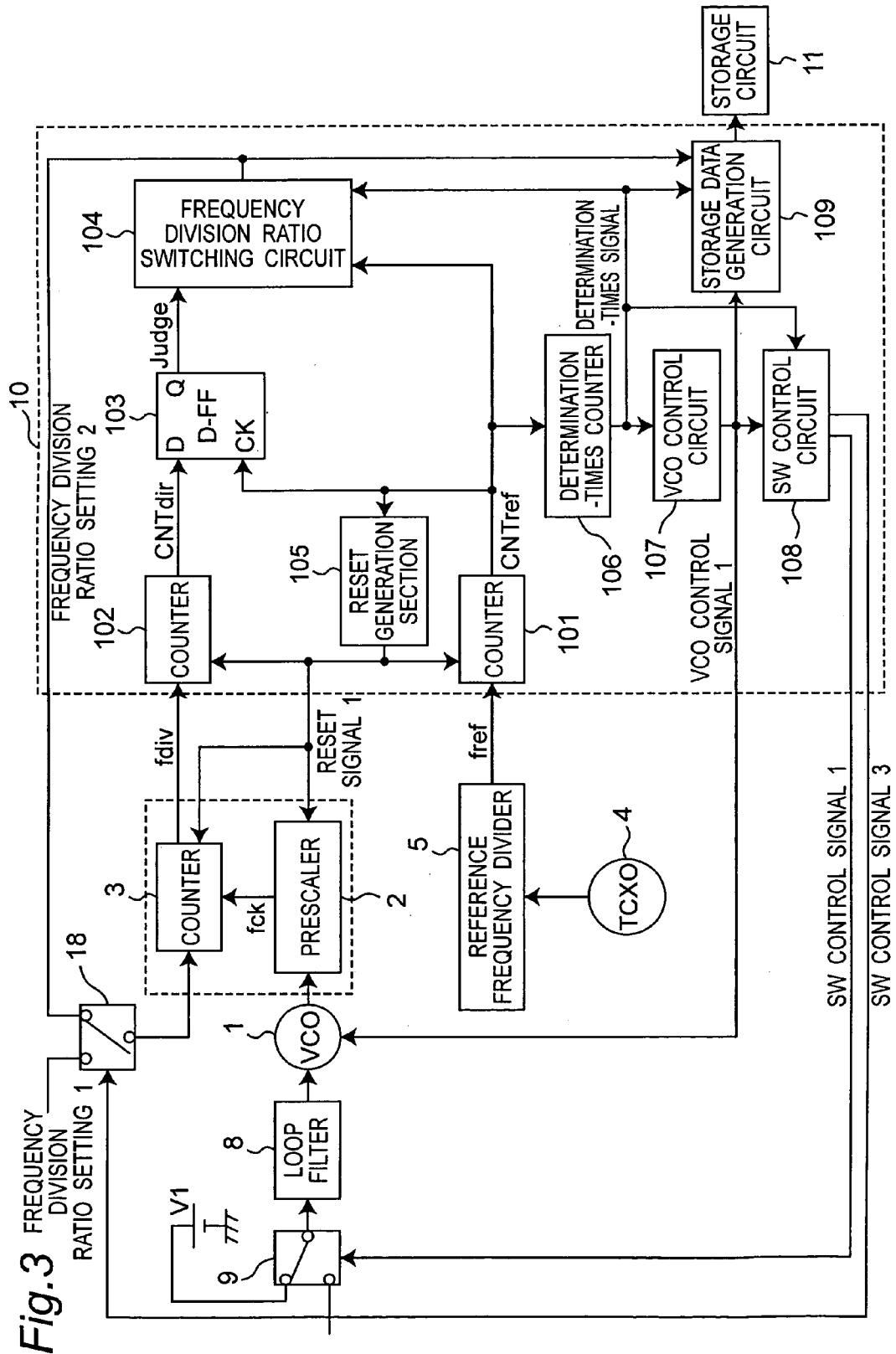
FIG. 3 is a block diagram showing a frequency examination section.
Figure 4:
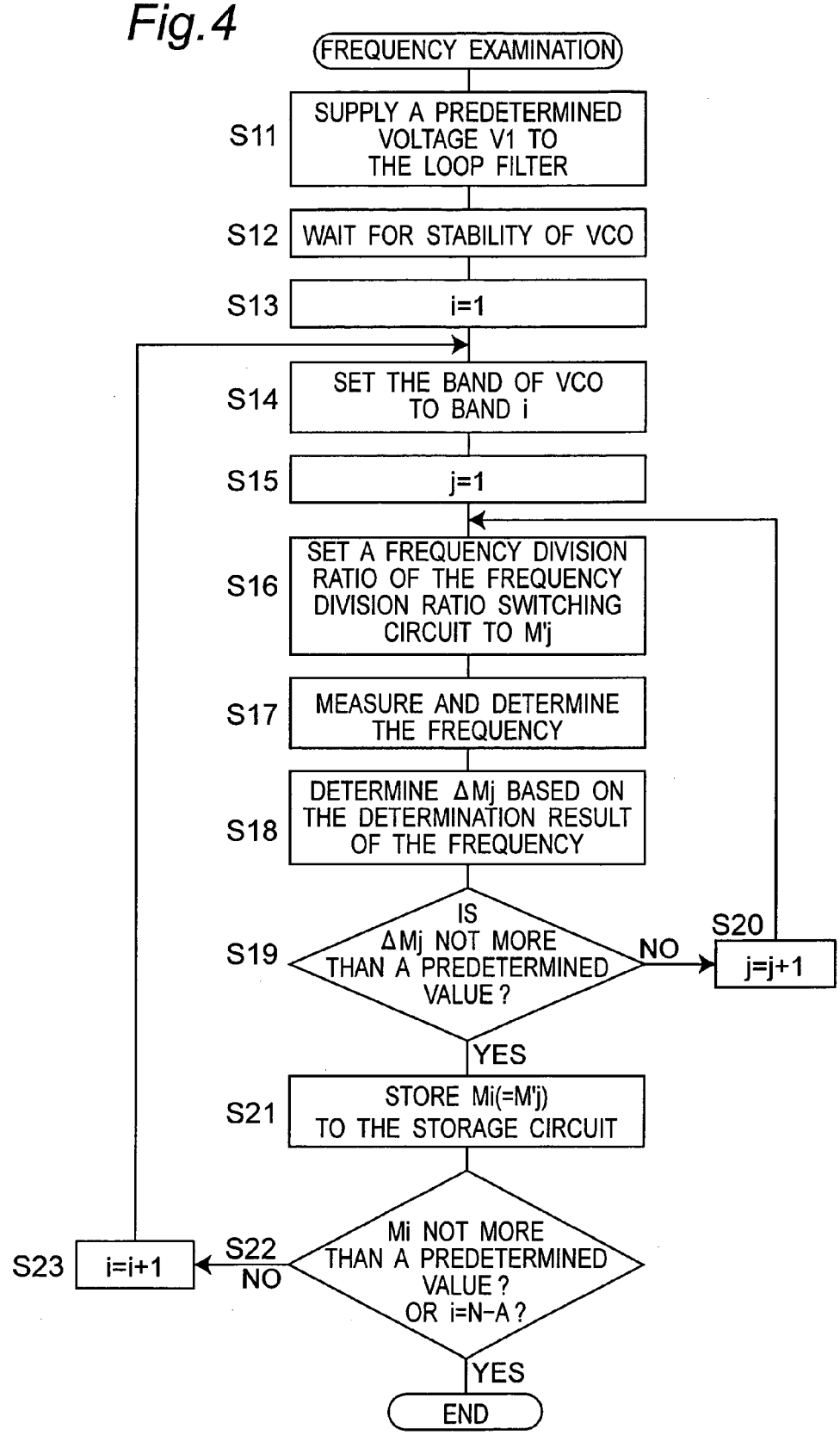
FIG. 4 is a flowchart of operation of the frequency examination section.

2.2 Examination (Measurement) and Storage of Oscillation Frequency of Each Band of VCO This operation is mainly implemented by the frequency examination section 10 within the band control circuit 50. FIG. 3 is a block diagram showing the frequency examination section 10 according to the embodiment. FIG. 4 is an operational flowchart of the frequency examination section 10.

Referring to FIG. 3, the frequency examination section 10 includes counters 101 and 102, a D flip-flop 103, a frequency division ratio switching circuit 104, a determination-times counter 106, a reset generation section 105, a VCO control circuit 107, a SW control circuit 108 and a storage data generation circuit 109.

The counter 101 counts the output signal $f_{ref}$ of the reference frequency divider 5 and the counter 102 counts the output signal $f_{div}$ of the counter 3. The counters 101 and 102 perform the count by the same number of times. The outputs of the counters 101 and 102 are respectively at L level (hereinafter referred to as "L") by reset, and are changed to H level (hereinafter referred to as "H") on termination of the count.

The determination-times counter 106 detects the termination of the frequency division ratio determination operation based on an output signal CNTref of the counter 101, and counts the number of termination detected to output the result as a determination-times signal. The determination-times signal corresponds to a variable j shown in the flowchart of FIG. 4.

The frequency division ratio switching circuit 104 determines the variation ΔMn of frequency division ratio based on the determination-times signal (the details of the variation ΔMn will be described later).

The VCO control circuit 107 compares the output of the determination-times counter 106 with a determination reference value. When the determination-times reaches a determination reference value, it is determined that the frequency examination of one band is completed, and the control signal (VCO control signal 1) for switching the band of VCO1 is generated in order to examine the frequency of the subsequent band.

The storage data generation circuit 109 detects termination of the frequency examination of one band when the determination times reaches the determination reference value, and generates data to be stored from a frequency division ratio setting 2 and the VCO control signal 1 observed at this time to store the data into the storage circuit 11.

The SW control circuit 108 detects whether the frequency examination is under way and generates the SW control signal 1 and SW control signal 3 for switching the switches 9 and 18.

The reset generation section 105 generates a reset signal 1. The reset signal 1 resets the counters 3, 101 and 102, and the prescaler 2 at the time when the frequency division ratio comparison operation is initiated. The reset state is released in synchronization with the output signal $f_{ref}$ of the reference frequency divider 5 so as to improve the accuracy of the comparison operation.

In general, in order to know accurately the oscillation frequency of VCO, it is necessary to count the number of clocks per second of VCO by means of a counter, or to count the number of clocks of VCO for a predetermined period of time to convert the count into a frequency per second. However, this requires a comparatively complex operation. According to the embodiment, for each band, there is detected and recorded a frequency division ratio obtained when frequency $f_r$ of reference signal $f_{ref}$ is equal to frequency $f_d$ of comparison signal $f_{div}$, and then the recorded frequency division ratio is compared with a frequency division ratio supplied from the outside to determine the band at which VCO1 is made to operate. With this method, it is possible to easily determine at which band VCO1 is operated. The relationship between frequency division ratio M to be determined, frequency $f_r$ of reference signal $f_{ref}$, and output $f_{VCO}$ of VCO is as follows.

$$f_{VCO} = f_r \times M$$

An operation of the frequency examination section 10 will be described below with reference to FIG. 4.

First, the state of the switch 9 is changed so that a predetermined voltage V1 is connected to the loop filter 8 (S11). The fixed voltage V1 is applied to a control terminal of VCO1, and then there is a wait until VCO1 oscillates stably at a given frequency (S12).

Variable i for specifying a band to be examined is set to 1 (S13). The band to be examined is set to band i (S14). Variable j indicating the determination times is set to 1 (S15).

In this state, a predetermined frequency division ratio M'1 is set in the frequency division ratio switching circuit 104 (S16).

Then, the reset of the counter 101 and the counter 102 is simultaneously released so that the count of reference frequency signal $f_{ref}$ and that of comparison frequency signal $f_{div}$ are initiated to perform the frequency measurement (S17). The output of the counters 101 and 102 is "L" at reset, and is changed to "H" simultaneously with the completion of counting. In the D flip-flop 103, a signal CNTref and signal CNTdiv are connected to a CK input and D input, respectively. When the count of the counter 101 is completed, the signal CNTref changes from "L" to "H". Thus, a value of CNTdiv is output as a signal "Judge" from the D flip-flop 103, thereby completing one measurement.

Subsequently, the frequency determination is performed based on the signal "Judge" (S17). The signal "Judge" which is "L" means that the count of the counter 102 is still under way at the time when the count of the counter 101 is completed. Specifically, frequency $f_d$ of the output signal $f_{div}$ of the counter 3 is lower than frequency $f_r$ of the reference signal $f_{ref}$ from the reference frequency divider 5 ($f_d < f_r$). In addition, there holds a formula: $f_{VCO} = f_d \times M'1$. Accordingly, at this time, it can be determined that M<M'1. Similarly, when the signal Judge is "H", it can be determined that M>M'1.

As known from the above description, the fact that the signal CNTref changes from "L" to "H" means that one frequency division ratio measurement and one determination operation are completed. When it is detected based on the signal CNTref that one frequency division ratio determination operation is completed, the frequency division ratio switching circuit 104 increases or decreases the frequency division ratio in accordance with the resulting signal "Judge" (S18).

When one frequency division ratio determination operation is completed, the reset generation section 105 resets the counters 101 and 102, thus initiating the subsequent frequency division ratio determination operation.

The variation of frequency division ratio will now be described. The increased or decreased quantity ΔMn for the first frequency division ratio determination operation is set to a predetermined positive value. The variation ΔMn for n-th (n≧2) frequency division ratio determination operation is set to a positive value smaller than a value ΔMn−1 which has been increased or decreased for the (n−1)th operation. A specific example of the variation of frequency division ratio will be given below.

First, suppose that the frequency division ratio for the first frequency division ratio determination operation is M'1, and as the determination result (S17), the signal "Judge" is "H". At this time, the frequency division ratio M to be determined is such that M'1<M. Accordingly, the frequency division ratio in the second frequency division ratio determination operation is increased (S18). The second frequency division ratio determination operation is performed by setting the frequency division ratio to M'2 (=M'1+ΔM1) (S16). When the second determination result (S17) is such that the signal "Judge" is "L", the frequency division ratio M to be determined is such that M<M'2. By combining this with the first frequency division ratio determination result, it can be seen that M'1<M<M'2. Accordingly, the frequency division ratio M is determined with an accuracy of ΔM1.

According to the second frequency division ratio determination, the signal "Judge" is "L". Thus, the third determination is performed by setting the frequency division ratio to M'3 (=M'3−ΔM2), where 0<ΔM2<ΔM1.

When the third determination result is such that the signal Judge is "L", the frequency division ratio M to be determined is such that M<M'3. By combining this with the first and second frequency division ratio determination results, it can be seen that M'1<M<M'3 (<M'2). In the third frequency division ratio determination, M is determined with an accuracy of ΔM2. Thus, it can be seen that the frequency division ratio M is determined with a higher accuracy than that of the second determination.

In the above-described way, the frequency division ratio determination is repeated until a required accuracy is achieved, i.e., until the variation AM becomes a predetermined value or less (S19, S20). Consequently, the frequency division ratio Mi to be determined is obtained. It is noted that, when the variation ΔMn for the n-th determination is set to one half the value ΔMn−1 which has been increased or decreased in the (n−1)th determination, the determination can be performed efficiently.

The frequency of the output $f_{ref}$ of the reference frequency divider 5 is compared with that of the output $f_{div}$ of the counter 3 to determine the frequency division ratio. Thus, in the pulse-swallow frequency divider 20 composed of the prescaler 2 and counter 3, even when the frequency division ratio being the output signal thereof changes instantaneously similarly to a frequency divider used in a generally known fractional N frequency synthesizer, the determination of frequency division ratio can be correctly performed. Herein, this does not depend on the variation ΔMn for the n-th determination being a fractional number, that is, the frequency division ratio M to be determined can be determined with high accuracy.

Also, when the prescaler 2 and counter 3 having a reset function are used, the phase of the signal $f_{ref}$ can be made to coincide with that of the signal $f_{div}$ by releasing these reset signals in synchronization with the signal $f_{ref}$ when the frequency division ratio determination operation is initiated. Thus, the frequency division ratio M to be determined can be determined with still higher accuracy.

In this way, the similar examination is performed for each of the predetermined bands of VCO1, and the obtained value of frequency division ratio Mi of each band is recorded onto the storage circuit 11 (S21, S22, S23). In this case, it is sufficient to perform the examination and recording of frequency division ratio Mi value only for part of the predetermined bands; it is not always necessary to perform the examination for all the bands of VCO1. The reason for this will be described later. When all the frequencies of the bands to be recorded are recorded, the frequency division ratio determination operation is terminated, and the flow proceeds to the idle mode.

In the above description, when the counter 101 terminates the count, the magnitude relation between frequency $f_d$ of the output signal $f_{div}$, and frequency $f_r$ of the reference signal $f_{ref}$ from the reference frequency divider 5 is determined based on the state of the counter 102. However, the magnitude relation between these frequencies may also be determined based on the state of the counter 101 when the counter 102 terminates the count. In order to employ this method, the signal CNTref and signal CNTdiv are connected to the D input and CK input of the D flip-flop 103, respectively.

In the above described way, when the operating power is applied to the frequency synthesizer, first, the oscillation frequency (frequency division ratio) at the predetermined voltage V1 is examined and recorded for the predetermined bands of VCO1. Then, before the original oscillation operation of the frequency synthesizer is initiated based on a frequency division ratio setting from the external PLL control circuit 14, an optimum band of VCO1 to be actually used is set by use of recorded oscillation frequency (frequency division ratio) of each band. The operation of setting the optimum band of VCO1 will be described below.

2.3 Selection of Initial Band

In order to determine an optimum band, first, one band is selected as the initial band by use of the frequency division ratio setting (frequency) of each band stored in the storage circuit 11.

With the frequency synthesizer according to the embodiment, suppose that VCO1 is designed so that, in VCO1, the phase locking can be performed in a predetermined frequency range (frequency $f_H$ to frequency $f_L$) even when manufacture variations of elements and a change of operational environment, such as temperature change and power source voltage variation, occur, and that oscillation frequency variations fall into a number A of adjacent bands under the change of operational environment, such as temperature change and power source voltage variation. In the case where VCO1 has a number N of bands, a band X is selected under a given environment, and VCO1 is oscillating at an oscillation frequency f, this means that, even when the environment changes, the oscillation is possible at the frequency f of any one of bands (X−A), (X−A+1), . . . , X, . . . , (X+A−1), (X+A), where 1≦X−A, X+A≦N, and 2A+1<N. In this case, the initial band (band X) can be selected from among bands (A+1) to (N−A).

After the determination of the initial band (band X), a band is selected by the frequency adjustment section 13 from among a number (2A+1) of bands ((X−A), (X−A+1), ..., X, ..., (X+A−1), (X+A)), which are the bands before and after the initial band (band X), so that the phase locking is performed at a desired frequency (frequency division ratio) specified by the PLL control circuit 14.

Figure 5:
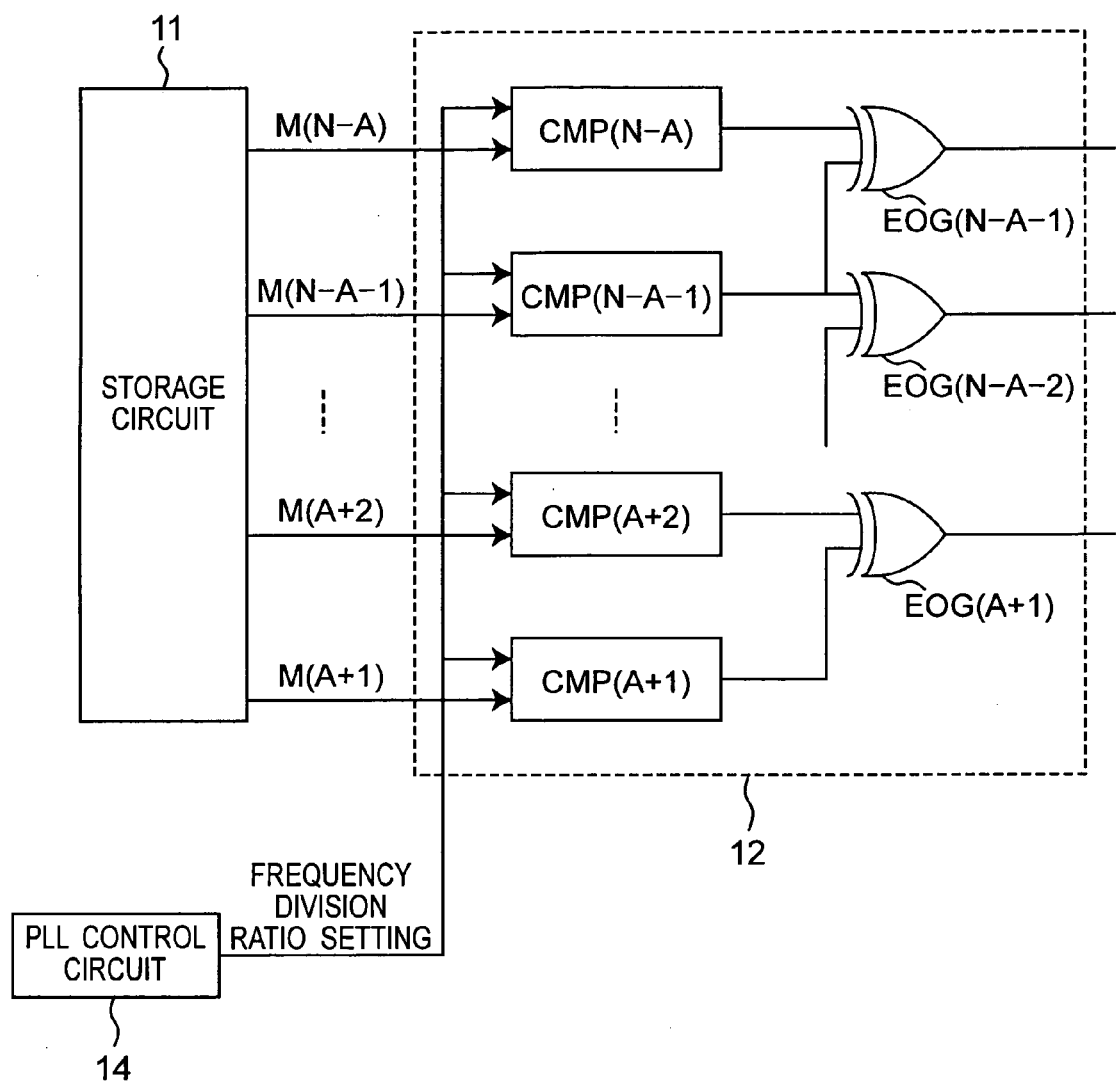
FIG. 5 is a block diagram of an initial-band selection circuit.

The selection of the initial band is mainly performed by the initial band selection circuit 12. FIG. 5 illustrates a configuration of the initial band selection circuit 12.

The initial band selection circuit 12 includes: comparators CMP (A+1), ... which compares a frequency division ratio setting being set into the counter 3 from the PLL control circuit 14 with a frequency division ratio stored in the storage circuit 11; and EOR gates EOG (A+1), ... which calculates an exclusive OR of the outputs of the two adjacent comparators. In this case, a sufficient way to obtain the selection result by the initial band selection circuit 12 in a small amount of time is to provide comparators (CMP (A+1) to CMP (N−A)) whose number corresponds to that of frequency bands of VCO1 stored, and a number (N−2A−1) of EOR gates (EOG (A+1) to EOG (N−A−1)). With this circuit configuration, only an EOR gate which locates at a boundary where the comparison result changes from "L" to "H" outputs a high level. Thus, a band corresponding to the output of such an EOR gate is selected as the initial band. When all the outputs of the EOR gates EOGs (A+1), ... are "L", band (A+1) can be selected as the initial band. When all the outputs are "H", band (N−A) can be selected as the initial band. If there is a margin for a processing time, a comparator, a latch circuit to hold the determination result of the comparator, and an EOR gate may be provided one by one so that they are operated on a time division basis. In this way, the initial band selection circuit 12 selects, as the initial band, a band having a frequency division ratio close to the frequency division ratio setting from the PLL control circuit 14.

As described above, the initial band (band X) may be selected from among bands (A+1) to (N−A). Thus, it is found that the oscillation frequency of VCO1 may be examined and stored only with respect to these bands. If a desired frequency is still lower than band (A+1) which is the lowest frequency band among the stored frequencies, then band (A+1) may be selected as the initial band. This is because, when the initial band is band (A+1), the frequency adjustment section 13 performs the band selection in a range from band 1 to band (2A+1). Similarly, if a desired frequency is still higher than the band (N−A) which is the highest frequency band among the stored frequencies, then band (N−A) may be selected as the initial band. Accordingly, it is found that the examination and storage may be performed with respect to bands (A+1) to (N−A) in the frequency examination section 10 and storage circuit 11. In addition, in a case where the examination of oscillation frequency is performed in ascending order from the lowest frequency band 1, when the oscillation frequency of a given band becomes higher than $f_H$, it is not necessary to examine with respect to higher frequency bands than this band. This is because the higher frequency bands than this band cannot be the initial band. Similarly, in a case where the examination of oscillation frequency is performed in descending order from the highest frequency band N, when the oscillation frequency of a given band becomes lower than $f_L$, it is not necessary to examine further.

2.4 Setting of Optimum Band

After the selection of the initial band, an optimum band to be actually used in oscillation operation is determined by the frequency adjustment section 13, and is set into VCO1. The frequency adjustment section 13 selects one band in which phase locking can be performed at the desired frequency, from among the initial band (band X) and a number (2A+1) of adjacent bands which are the bands before and after the initial band.

Figure 6:
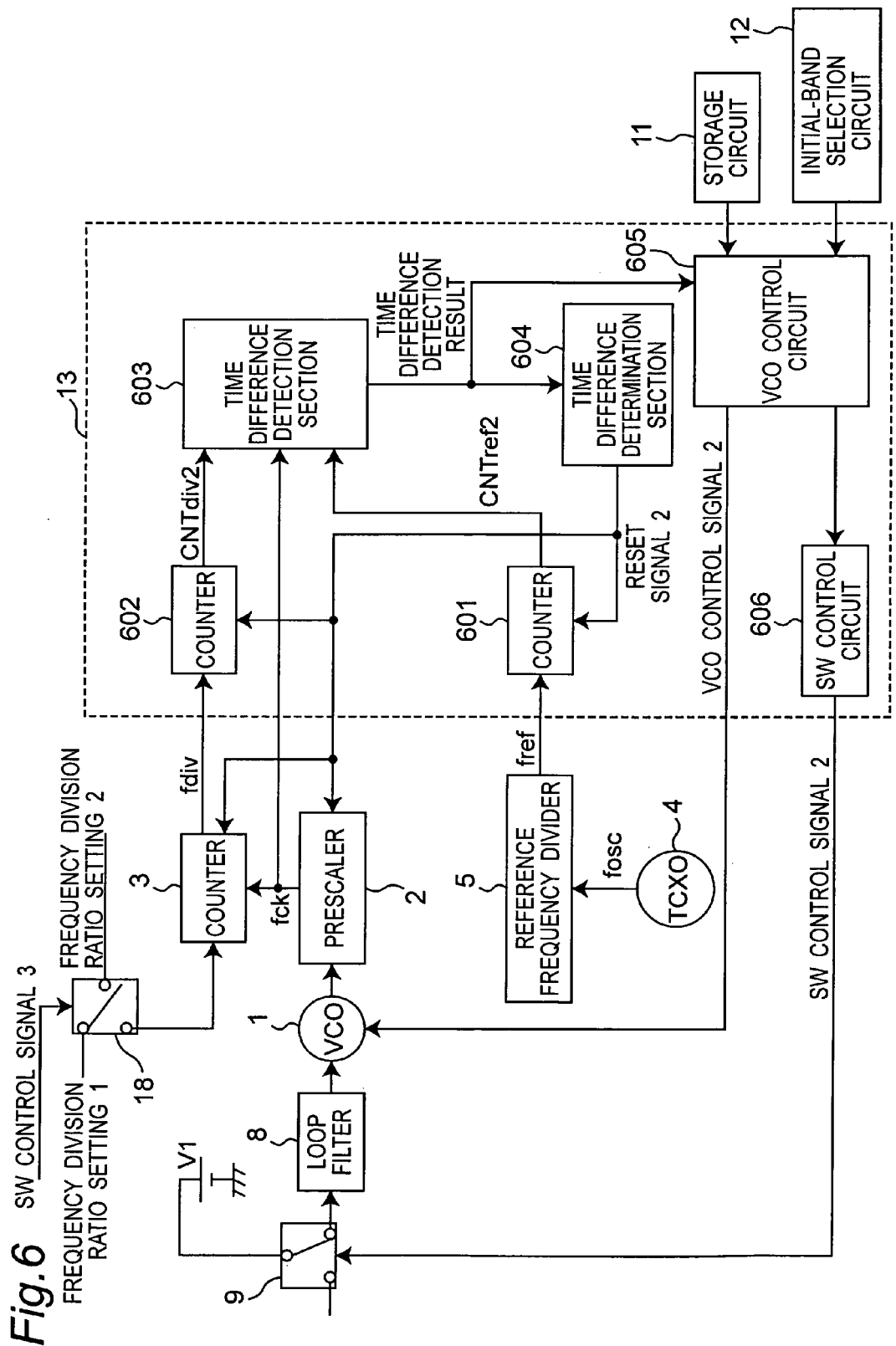
FIG. 6 is a block diagram of a, frequency examination section.

FIG. 6 is a block diagram showing the frequency adjustment section 13. The frequency adjustment section 13 includes counters 601 and 602, a time difference detection section 603, time difference determination section 604, VCO control circuit 605 and SW control circuit 606.

First, when a frequency division ratio setting 1 is newly set from the PLL control circuit 14, the information on initial band is input from the initial band selection circuit 12 to the VCO control circuit 605. The VCO control circuit 605 causes VCO1 to oscillate at the band selected as the initial band. At this time, the SW control circuit 606 switches the switch 9 so that a predetermined voltage V1 is supplied to VCO1, thereby causing VCO1 to oscillate at a given frequency.

Subsequently, the oscillation frequency is adjusted. The reset state of the counters 601 and 602 is simultaneously released by the time difference determination section 604, and then the counters 601 and 602 counts signals $f_{ref}$ and $f_{div}$ by a given number (N), respectively. Upon completion of counting, the counters 601 and 602 outputs signals CNTref2 and CNTdiv2 to the time difference detection section 603, respectively.

When the desired frequency (defined by frequency division ratio setting 1) is f, the frequency division ratio thereof is Mlock, the oscillation frequency of VCO1 is $f_v$, the elapsed time taken from the release of reset of the counter 601 to the completion of counting is CNTref2, and the elapsed time taken from the release of reset of the counter 602 to the completion of counting is CNTdiv2, then the following formula is provided.

CNTref2=N×Mlock×f

CNTdiv2=N×Mlock×$f_v$

Accordingly, the difference between the desired frequency f and oscillation frequency of VCO1 can be known by detecting, by the time difference detection section 603, the time difference between the elapsed time CNTref2 and elapsed time CNTdiv2. In this case, the frequency difference between the signals f and $f_v$ can be more accurately detected by releasing the reset of the counter 3 and prescaler 2 in synchronization with the signal $f_{ref}$. The difference detection section 603 detects CNTref2 and CNTdiv2, and counts the time difference between these signals by use of the output signal $f_{ck}$ of the prescaler 2. Herein, the time difference is counted with the output signal $f_{ck}$ of the prescaler 2. Alternatively, the output signal $f_{OSC}$ of TCXO4 may be used.

The VCO control circuit 605 predicts an optimum band at which VCO1 is lockable at the desired frequency f, based on the detection result of time difference and the oscillation frequency data of VCO1 stored in the storage circuit 11, and then switches the operation band of VCO1 to the predicted band. By taking as an example a case in which A=2, the optimum band prediction will be described below.

First, the actual oscillation frequency of VCO1 at the initial band (band X) is expected based on the detection result of time difference and the oscillation frequency data of VCO1 stored in the storage circuit 11. When the expected oscillation frequency of the initial band is higher than the desired frequency f, and the frequency difference is one band or less, then band (band X−1) being lower by one band is predicted to be the optimum band. When the expected oscillation frequency of the initial band is lower than the desired frequency f, and the frequency difference is one band or less, then the band X is predicted to be the optimum band. When the expected oscillation frequency of the initial band is lower than the desired frequency f, and the frequency difference is one band or more and at the same time two bands or less, band (band X+1) being higher by one band is predicted to be the optimum band. When the expected oscillation frequency of the initial band is lower than the desired frequency f, and the frequency difference is two bands or more, band (band X+2) being higher by two bands is predicted to be the optimum band.

The above described operation is one cycle of the frequency adjustment operation.

The time difference determination section 604 determines whether or not VCO1 is lockable, at the desired frequency f, at the current band, based on the detection result of time difference, and the detection accuracy of time difference or the band prediction accuracy. When it is determined that VCO1 is not lockable, then the reset signal 2 is outputted again. Then, with a new band of VCO1 obtained after the switching, the frequency adjustment operation is performed once again. This is repeated until it is determined that VCO1 is lockable.

As described above, the optimum band is determined. The determined optimum band is set into VCO1 before oscillation operation.

With the embodiment, the oscillation frequency of each band of VCO1 is measured and stored, and then the oscillation frequency of VCO1 is once again measured immediately before the initiation of oscillation operation, thereby determining the optimum band to be finally used. Accordingly, even when the operational environment changes during a time from storage of the measured oscillation frequency of each band of VCO1 till the initiation of oscillation operation, the optimum band can be determined with high accuracy without being affected by the change.

The frequency adjustment operation is performed after the frequency division ratio setting of a desired frequency is sent from the PLL control circuit 14. Thus, the operation time for the frequency adjustment is added to the lock-up time. With conventional frequency adjustment circuits, since the accuracy of predicting a band at which VCO1 is lockable is low, the number of times of frequency adjustment operation is large, consequently increasing the lock-up time. In contrast, with the present invention, the accuracy of predicting a band at which VCO1 is lockable can be raised by means of the following two techniques, and the lock-up time can be shortened.

First, as described above, the frequency adjustment operation is performed at band X being the initial band. Accordingly, it can be predicted that the number of bands at which VCO1 is lockable does not exceed 2A+1 since VCO1 is designed so as to oscillate at a number (2A+1) of bands (a total of the initial band X and a number A of adjacent bands).

Second, the oscillation frequency of each band is stored. Accordingly, if there is known the stored oscillation frequency of band X and the current oscillation frequency of band X expected from the time difference detection result, then the current oscillation frequency of another band can be predicted with high accuracy from the stored oscillation frequency of the another band (band X+1, for example).

In this way, according to the present invention, the frequency adjustment operation can be completed in a short period of time, thus reducing the lock-up time. Accordingly, from the above described reason, the frequency synthesizer with a satisfactory C/N performance can be obtained.

3. Application to Radio Communication System

Figure 7:
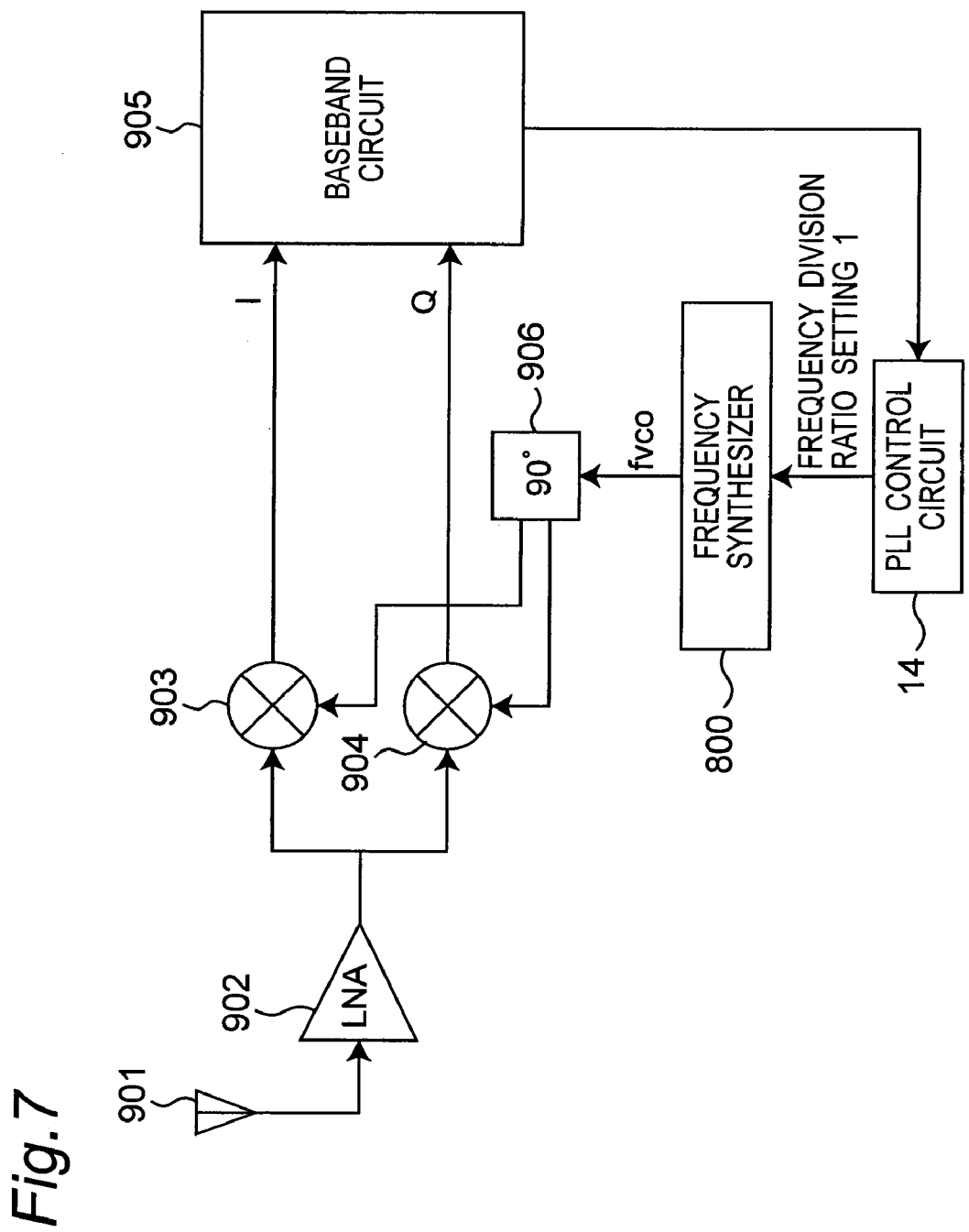
FIG. 7 is a block diagram of a radio communication system using the frequency synthesizer according to the embodiment.

FIG. 7 shows an example in which the frequency synthesizer according to the embodiment is applied to a radio communication system. With the frequency synthesizer according to the embodiment, a miniaturized and low-cost radio communication system with a satisfactory communication quality can be realized. FIG. 7 shows a schematic configuration of a typical direct-conversion receiving system including an antenna 901, a low-noise amplifier 902, mixers 903 and 904, a 90-degree phase shifter 906, a frequency synthesizer 800 and a baseband circuit 905. As the frequency synthesizer 800, the above described frequency synthesizer is used. It is understood that the frequency synthesizer according to the embodiment is also applicable to radio communication systems with a method other than direct-conversion method and to other electronic apparatuses with a frequency synthesizer.

4. INDUSTRIAL APPLICABILITY

The present invention is useful for a frequency synthesizer with a VCO having multiple oscillation frequency bands, and is also useful for various electronic apparatuses with a frequency synthesizer, for example, for a radio communication system.

The present invention has been described with respect to a specific embodiment. However, those skilled in the art will recognize that many changes or modifications to the embodiment described above and other applications are possible. Accordingly, the present invention should not be restrictively interpreted by the description of the specific embodiment, and can be limited only by the appended claims. The present invention is related to Japanese Patent Application No. 2004-42425 (filed on Feb. 19, 2004), the disclosure of which is incorporated herein by reference.

What is claimed is:

1. A frequency synthesizer comprising:
a voltage controlled oscillator that can oscillate at multiple frequency bands, and outputs a signal of a frequency corresponding to a voltage applied to a control voltage terminal;
a comparison frequency divider that outputs a signal obtained by dividing the frequency of the voltage controlled oscillator;
a reference frequency divider that outputs a signal obtained by dividing the frequency of a reference signal;
a phase comparator that compares the phase between the output signal of the comparison frequency divider and the output signal of the reference frequency divider to output the phase difference;
a charge pump that converts the output signal of the phase comparator into a voltage;
a loop filter which smoothes the output voltage of the charge pump to apply the resulting voltage to the control voltage terminal of the voltage controlled oscillator based on counts determined from the outputs of the comparison frequency divider and the reference frequency divider that will allow for measuring the oscillation frequency; and
a band control circuit that sets the frequency band of the voltage controlled oscillator for oscillation operation, the band control circuit including:
a frequency examination section that measures the oscillation frequency for each of a predetermined number of frequency bands of the voltage controlled oscillator;

a storage section that stores the oscillation frequency of each frequency band measured by the frequency examination section;

an initial-band selection section that selects, based on a frequency supplied from a PLL control circuit, one of the frequency bands whose oscillation frequency is stored in the storage section; and a frequency adjustment section that measures the oscillation frequency of the voltage controlled oscillator at the one frequency band selected by the initial-band selection section, determines one frequency band to be used in oscillation operation based on the measured oscillation frequency, and sets the determined frequency band into the voltage controlled oscillator.

2. The frequency synthesizer according to claim 1, wherein the frequency examination section includes a first counter which counts the output signal of the reference frequency divider by a predetermined number, and a second counter which counts the output signal of the comparison frequency divider by a predetermined number, and detects completion of counting in the first counter to measure the oscillation frequency of the voltage controlled oscillator based on the state of the second counter and the frequency division ratio of the comparison frequency divider at the time of the completion of counting in the first counter.

3. The frequency synthesizer according to claim 1, wherein the frequency examination section includes a first counter which counts the output signal of the reference frequency divider by a predetermined number, and a second counter which counts the output signal of the comparison frequency divider by a predetermined number, and detects completion of counting in the second counter to measure the oscillation frequency of the voltage controlled oscillator based on the state of the first counter and the frequency division ratio of the comparison frequency divider at the time of the completion of counting in the second counter.

4. The frequency synthesizer according to claim 1, wherein the initial-band selection section includes a comparator which compares the frequency supplied from the PLL control circuit with each oscillation frequency stored in the storage section to generate a signal for specifying the one frequency band.

5. The frequency synthesizer according to claim 1, wherein the frequency adjustment section applies a fixed voltage to the voltage controlled oscillator to cause the oscillator to oscillate at the frequency band selected by the initial-band selection section, and determines one frequency band to be used in oscillation operation based on the oscillation frequency obtained by applying the fixed voltage to the voltage controlled oscillator and an error between the oscillation frequency and a reference frequency.

6. The frequency synthesizer according to claim 1, wherein based on the frequency difference between the output signal of the reference frequency divider and the output signal of the comparison frequency divider and the oscillation frequency of the one frequency band stored in the storage section, the frequency adjustment section predicts the oscillation frequency of another frequency band.

7. A radio communication system with the frequency synthesizer according to claim 1.

* * * * *